(12) United States Patent
Marquez

(10) Patent No.: US 6,228,774 B1
(45) Date of Patent: May 8, 2001

(54) HIGH ASPECT RATIO SUB-MICRON CONTACT ETCH PROCESS IN AN INDUCTIVELY-COUPLED PLASMA PROCESSING SYSTEM

(75) Inventor: Linda N. Marquez, Fremont, CA (US)

(73) Assignee: Lam Research Corporation, Fremont, CA (US)

( * ) Notice: Subject to any disclaimer, the term of this patent is extended or adjusted under 35 U.S.C. 154(b) by 0 days.

(21) Appl. No.: 09/222,551

(22) Filed: Dec. 29, 1998

(51) Int. Cl.$^7$ .................................................. H01L 21/00
(52) U.S. Cl. ............................................ 438/710; 438/711
(58) Field of Search ...................... 438/710, 711

(56) References Cited

U.S. PATENT DOCUMENTS

| | | | | |
|---|---|---|---|---|
| 4,214,946 | * | 7/1980 | Forget et al. | 156/643 |
| 4,568,410 | * | 2/1986 | Thornquist | 156/643 |
| 5,176,790 | | 1/1993 | Arleo et al. | |
| 5,429,710 | | 7/1995 | Akiba et al. | |
| 5,811,195 | * | 9/1998 | Bercaw et al. | 428/472 |
| 5,965,463 | * | 10/1999 | Cui et al. | 438/723 |
| 5,968,278 | | 10/1999 | Young et al. | |

FOREIGN PATENT DOCUMENTS

| | | |
|---|---|---|
| 0496614 | 7/1992 | (EP) . |
| 0777267 | 6/1997 | (EP) . |
| 0840365 | 5/1998 | (EP) . |
| 0964438 | 12/1999 | (EP) . |
| WO98/19332 | 5/1998 | (WO) . |

OTHER PUBLICATIONS

Iijima, et al., "Highly Selective $SiO_2$ Etch Empolying Inductively Coupled Hydro–Fluorocarbon Plasma Chemistry for Self Aligned Contact Etch," Japanese Journal of Applied Physics, JP, Publication Office of Japanese Journal of Applied Physics, Tokyo, vol. 36, No. 9A, Sep. 1997, pp. 5498–5501.

* cited by examiner

Primary Examiner—Benjamin L. Utech
Assistant Examiner—Charlotte A. Brown
(74) Attorney, Agent, or Firm—Beyer Weaver & Thomas, LLP

(57) ABSTRACT

The invention relates to a method of etching a feature in an oxide layer using a photoresist mask, the oxide layer being disposed above an underlying layer of a substrate inside an inductively-coupled plasma processing chamber. The method includes flowing an etchant source gas that includes $CH_2F_2, C_4F_8$ and $O_2$ or $C_3H_3F_5, C_4F_8$ and $O_2$ into the plasma processing chamber. The method further includes forming a plasma from the etchant source gas. The method additionally includes etching through the oxide layer of the substrate with the plasma, wherein the etching substantially stops on the underlying layer, the underlying being one of a silicon layer, a tungsten-based layer or a TiN layer.

68 Claims, 5 Drawing Sheets

HIGH ASPECT RATIO SUB-MICRON CONTACT ETCH PROCESS IN AN INDUCTIVELY-COUPLED PLASMA PROCESSING SYSTEM

BACKGROUND OF THE INVENTION

The present invention relates to the fabrication of semiconductor integrated circuits (IC's). More particularly, the present invention relates to methods and apparatuses for etching through an IC's layer stack, including an oxide layer, during IC fabrication to create etched features therein.

During the manufacture of a semiconductor-based product, for example, a flat panel display or an integrated circuit, multiple deposition and/or etching steps may be employed. During the deposition step, materials are deposited onto a substrate surface (such as the surface of a glass panel or a wafer). Conversely, etching may be employed to selectively remove materials from predefined areas on the substrate surface. Etching in this manner can create etched features (such as vias, contacts, or trenches) in the oxide layer of a substrate surface wherein the etched features may be filled with metal to form a conductive path. As the term is employed herein, an oxide layer refers to a layer formed of a silicon dioxide-containing material such as TEOS (tetraethylorthosilicate), BPSG (borophosphosilicate glass), PSG (phosporous-doped silicate glass) and the like.

During etching, a mask formed of a suitable mask material, such as photoresist, is typically employed to define the areas to be etched in the oxide layer. In an exemplary photoresist technique, the photoresist material is first deposited on the oxide layer to be etched. The photoresist material is then patterned by exposing the photoresist material in a suitable lithography system, and by developing the photoresist material to form a mask to facilitate subsequent etching. Areas of the target layer (e.g., the oxide layer) that are unprotected by the mask may then be etched away using an appropriate etchant source gas, thereby forming etched features in the underlying layer.

Referring initially to FIG. 1a, there is shown a layer stack 10 (not drawn to scale for ease of illustration). A substrate 20 is located at the bottom of layer stack 10 and includes a semiconductor wafer, which is typically formed of silicon. Substrate 20 may also include any other layers that may underlie an oxide layer to be etched. An oxide layer 24 is formed above substrate 20. To create an etched feature to substrate 20 through oxide layer 24, a layer of photoresist material is deposited and patterned using a conventional photolithography step. After patterning, an initial opening 26 is created in photoresist mask 28 to facilitate subsequent oxide etching. The above-described layers and features, as well as the processes involved in their creation, are well known to those skilled in the art.

FIG. 1b shows the same layer stack 10 of FIG. 1a and its layers after processing. Within photoresist mask 28, there is shown an opening 26, which is created during the mask patterning process. Through opening 26, etchants (or more specifically plasma formed from such etchants) react with the material of oxide layer 24 to etch features in oxide layer 24. During this etching process, the etchants tend to anisotropically etch oxide layer 24 through opening 26 in photoresist mask 28, forming an etched feature 30 having a diameter (or width) 32 and a depth 34. The diameter (or width) is generally refers to as the feature size and tends to decrease with increasing circuit density. The aspect ratio is the ratio of depth to width, and tends to increase as the denominator of this ratio, i.e., the width, is decreased. After the etched feature is formed, a metal conductor may be deposited to contact the underlying layer(s) of substrate 20 through etched feature 30.

FIG. 1b also depicts, as shown by the dotted lines, the layers that are also impacted by the etchants. As can be appreciated by one skilled in the art and though the illustration was not drawn to scale, photoresist layer 28 is eroded at a different rate than oxide layer 24. Typically, the oxide layer is etched at a much faster rate than the photoresist layer. The difference between the two etching rates may be quantified by a ratio generally referred to as the oxide-to-photoresist selectivity. By way of example, if the oxide-to-photoresist selectivity 3:1, the oxide layer is etched three (3) times faster than the photoresist layer.

To achieve greater circuit density, modern integrated circuits are scaled with increasingly narrower design rules. By way of example, it is not uncommon to employ design rules as small as 0.18 microns or even smaller in the fabrication of some high density integrated circuits. As the devices are packed closer together, increased oxide-to-photoresist selectivity is needed because a thin layer of photoresist is typically applied. Further, as the width of the etched features decreases, the aspect ratio increases, necessitating a high aspect ratio etch process. Further, as the width of the etched features decreases, the need for straight sidewall profiles increase. Straight profiles ensure that the subsequently deposited metal material can properly fill the etched feature, e.g., without suffering voids due to pinch-offs, or the like.

Furthermore, current chemistries employed to etch through the oxide layer tend to be toxic to the environment. Thus, the byproduct exhaust gases tend to require extensive treatment before they can be properly discharged. Such treatment tends to require costly scrubbing devices and/or processes, which increases the final cost of the semiconductor-based products.

In view of the foregoing, there are desired improved techniques for etching features having narrow widths, high aspect ratios and straight profiles in the oxide layer.

SUMMARY OF THE INVENTION

The invention relates, in one embodiment, to a method of etching a feature in an oxide layer using a photoresist mask, the oxide layer being disposed above an underlying layer of a substrate in an inductively-coupled plasma processing chamber. The method includes flowing an etchant source gas that includes $CH_2F_2$, $C_4F_8$ and $O_2$ into the plasma processing chamber. The method further includes forming a plasma from the etchant source gas. The method additionally includes etching through the oxide layer of the substrate with the plasma, wherein the etching substantially stops on the underlying layer, the underlying being one of a silicon layer and a tungsten-based layer.

The invention relates, in another embodiment, to a method of etching a feature in an oxide layer using a photoresist mask, the oxide layer being disposed above an underlying layer of a substrate, the substrate being disposed on an electrostatic chuck in an inductively-coupled plasma processing chamber during the etching. The method includes flowing an etchant source gas that comprises $CH_2F_2$, $C_4F_8$ and $O_2$ into the plasma processing chamber. The method further includes forming a plasma from the etchant source gas. The method additionally includes etching through the oxide layer of the substrate with the plasma, the etching substantially stops on the underlying layer, the underlying being one of a silicon layer and a tungsten-based layer, wherein the plasma processing chamber includes a temperature-controlled top electrode, a distance between the top electrode and the electrostatic chuck is about 10 cm during the etching.

The invention relates, in another embodiment, to a method of etching a feature in an oxide layer using a photoresist mask, the oxide layer being disposed above an underlying layer of a substrate in an inductively-coupled plasma processing chamber. The method includes flowing an etchant source gas that includes $C_3H_3F_5, C_4F_8$ and $O_2$ into the plasma processing chamber. The method further includes forming a plasma from the etchant source gas. The method additionally includes etching through the oxide layer of the substrate with the plasma, wherein the etching substantially stops on the underlying layer, the underlying being one of a silicon layer and a TiN layer.

The invention relates, in yet another embodiment, to a method of etching a feature in an oxide layer using a photoresist mask, the oxide layer being disposed above an underlying layer of a substrate, the substrate being disposed on an electrostatic chuck in an inductively-coupled plasma processing chamber during the etching. The method includes flowing an etchant source gas that comprises $C_3H_3F_5, C_4F_8$ and $O_2$ into the plasma processing chamber. The method further includes forming a plasma from the etchant source gas. The method additionally includes etching through the oxide layer of the substrate with the plasma, the etching substantially stops on the underlying layer, the underlying being one of a silicon layer and a TiN layer, wherein the plasma processing chamber includes a temperature-controlled top electrode, a distance between the top electrode and the electrostatic chuck is about 10 cm during the etching.

These and other advantages of the present invention will become apparent upon reading the following detailed descriptions and studying the various figures of the drawings.

BRIEF DESCRIPTION OF DRAWINGS

The present invention is illustrated by way of example, and not by way of limitation, in the figures of the accompanying drawings and in which like reference numerals refer to similar elements and in which.

DETAILED DESCRIPTION OF PREFERRED EMBODIMENTS

The present invention will now be described in detail with reference to a few preferred embodiments thereof and as illustrated in the accompanying drawings. In the following description, numerous specific details are set forth in order to provide a thorough understanding of the present invention. It will be obvious, however, to one skilled in the art, that the present invention may be practiced without some or all of these specific details. In other instances, well known process steps have not been described in detail in order not to unnecessarily obscure the present invention.

In accordance with one aspect of the present invention, high aspect ratios and increased oxide-to-photoresist selectivity is achieved by etching an oxide layer with an inventive etchant source gas chemistry in a plasma processing chamber. The etching takes place while the substrate is disposed on a chuck within a plasma processing chamber. Typically, the etchant source gas is flowed into the chamber, and the pressure is stabilized. After the pressure has been stabilized the plasma is ignited, thereby generating ions from the etchant source gas. Next, the plasma is stabilized and the ions are accelerated towards the substrate where they etch the oxide layer. As mentioned, the etched features may be employed as vias, contact openings, or trenches (such as those employed for trench capacitors in DRAM circuits, for example).

In one embodiment, an etchant source gas chemistry of $CH_2F_2/C_4F_8/O_2$ is employed to etch features through an oxide layer down to an underlying silicon layer. When the $CH_2F_2/C_4F_8/O_2$ chemistry is employed with the etch parameters disclosed herein, the etch process produces small features in the oxide layer with high aspect ratios while providing good selectivity to the photoresist mask and underlying silicon layer. The $CH_2F_2/C_4F_8/O_2$ etchant source gas chemistry may also be employed to etch features through an oxide layer down to an underlying tungsten-based layer. When the $CH_2F_2/C_4F_8/O_2$ chemistry is employed with the etch parameters disclosed herein, good selectivities to the photoresist mask and underlying tungsten-based layer are also achieved.

In one embodiment, an etchant source gas chemistry of $C_3H_3F_5/C_4F_8/O_2$ is employed to etch features through an oxide layer down to an underlying silicon layer. When the $C_3H_3F_5/C_4F/O_2$ chemistry is employed with the etch parameters disclosed herein, the etch process produces small features in the oxide layer with high aspect ratios while providing good selectivity to the photoresist mask and underlying silicon layer. The $C_3H_3F_5/C_4F_8/O_2$ etchant source gas chemistry may also be employed to etch features through an oxide layer down to an underlying TiN layer. When the $C_3H_3F_5/C_4F_8/O_2$ chemistry is employed with the etch parameters disclosed herein, good selectivities to the photoresist mask and underlying TiN layer are also achieved.

Figure 1A:
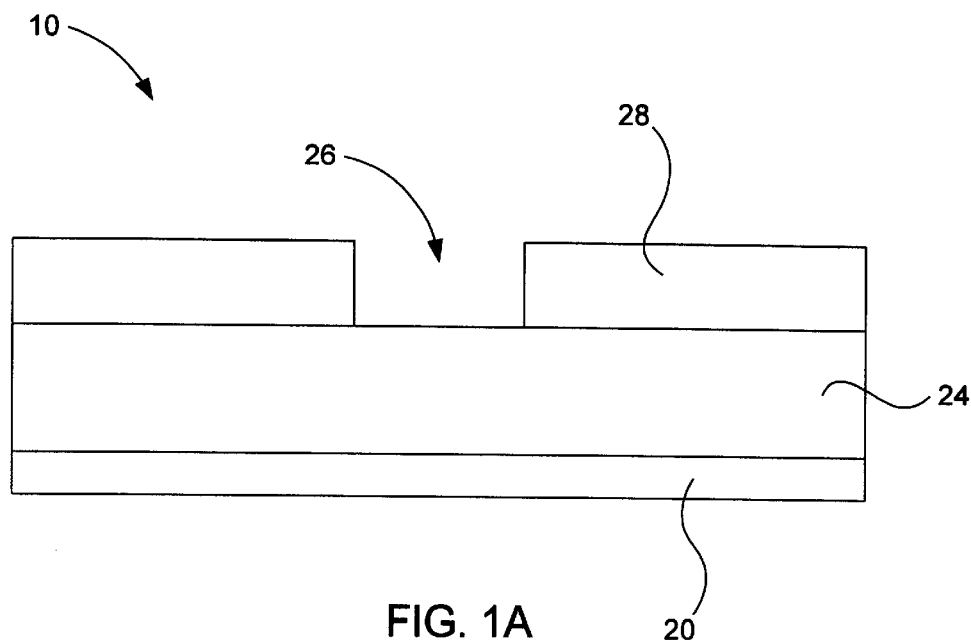
FIG. 1a illustrates a cross-sectional view of a layer stack, representing some of the layers formed during the fabrication of a typical semiconductor IC.
Figure 1B:
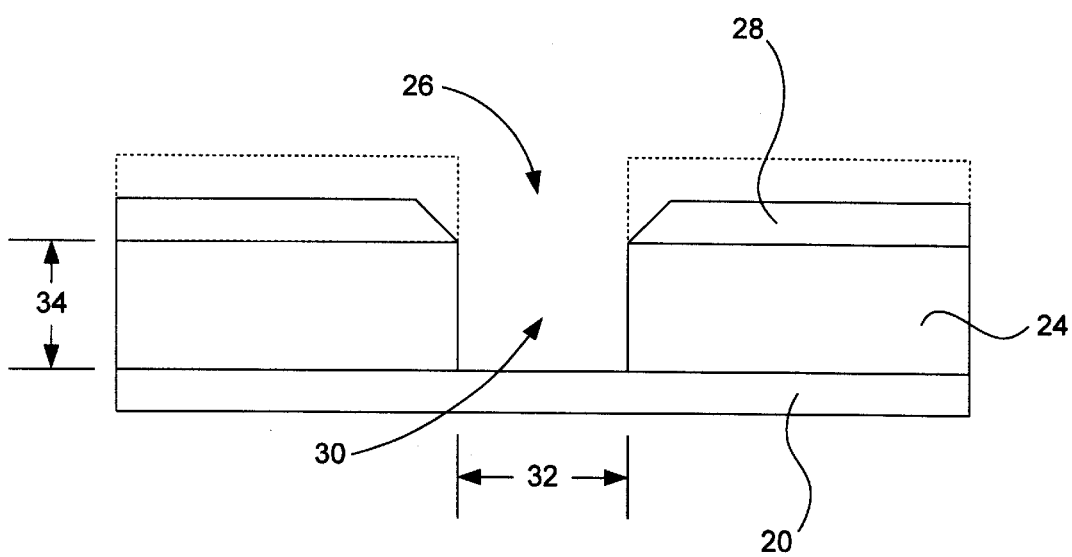
FIG. 1b shows the same layer stack of FIG. 1a after a contact opening has been etched through the oxide layer.
Figure 2:
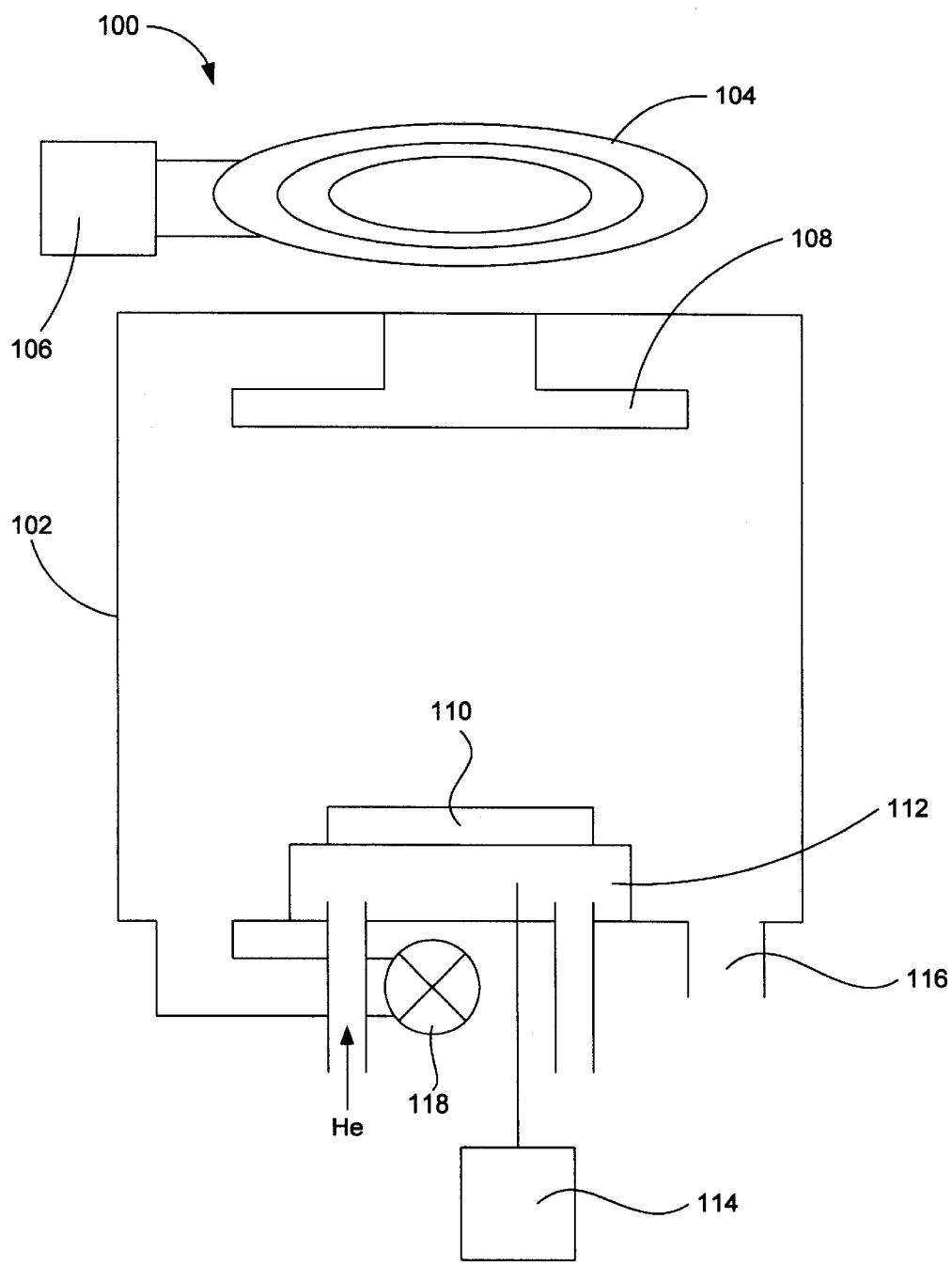
FIG. 2 is a simplified schematic diagram of a plasma reactor that may be suitably employed with the inventive etch process.

In a preferred embodiment, the present invention is practiced in a modified TCP™ 9100 plasma reactor, which is available from Lam Research Corporation. FIG. 2 illustrates a simplified schematic of the modified TCP™ 9100 plasma reactor. Plasma reactor 100 includes a plasma processing chamber 102. Chamber 102 is preferably made from anodized aluminum. Above chamber 102, there is disposed an inductive electrode 104 (represented by a coil). Inductive electrode 104 is powered by a first RF power source 106 via a matching network (not shown in FIG. 2 to simplify the illustration).

Typically, a gas distribution plate or shower head 108 is provided within chamber 102. Shower head 108 is preferably made from silicon nitride or another suitable material and includes a plurality of holes for releasing gaseous source materials, e.g., the etchant source gases, into the RF-induced plasma region between shower head 108 and a substrate 110. The gaseous source materials may also be released from ports built into the walls of the chamber itself. Substrate 110 is introduced into chamber 102 and disposed on a chuck 112, which acts as a bottom electrode and is preferably biased by a second RF power source 114 (also typically via a matching network). Chuck 112 may also include a focus ring (not shown to simplify illustration), preferably made from silicon nitride or a combination of silicon nitride and silicon carbide, positioned around the bottom electrode. Chuck 112 may represent, for example, an ESC (electrostatic) chuck, which secures substrate 110 to the chuck's surface by electrostatic force.

Helium cooling gas is introduced under pressure (e.g., about 20 Torr in one embodiment) between chuck 112 and substrate 110 to act as a heat transfer medium for accurately controlling the substrate temperature during processing to ensure uniform and repeatable etching results. During plasma etching, the pressure within chamber 102 is preferably kept low by exhausting the byproduct gas through port 116, e.g., between slightly above 0 mTorr to about 30 mTorr during etching. A plurality of heaters (omitted from FIG. 2 to simplify the illustration) may be provided to maintain a suitable chamber temperature for etching. To provide an electrical path to ground, the chamber wall of chamber 102 is typically grounded.

In one embodiment of the present invention, in the plasma reactor 100, a gap between the lower surface of shower head (top electrode) 108 and the upper surface of chuck (bottom electrode) 112 is preferably set during etching at about 10 cm. While not wishing to be bound by theory, it is believed that a larger gap has the effect of providing a larger chamber volume that allows the torroidally induced plasma to diffuse into a uniform plasma before contacting substrate 110. Thus, it is believed that the gap of 10 cm between chuck 112 and shower head 108 may enhance the uniformity of the plasma, particularly over gaps of less than 10 cm. A uniform plasma, typically, generates a more uniform etch from the center region of substrate 110 to the edge of substrate 110.

Plasma reactor 100 is a modified design based on the Lam Research TCP™ 9100 reactor that also includes provisions (not shown to simplify illustration) for circulating a coolant, e.g., glycol or deionized water, through the antenna of inductive electrode 104 to control the temperature of inductive electrode 104. The antenna is bonded to the dielectric window which is in physical contact with shower head 108. The coolant is circulated by a chiller (not shown to simplify illustration). The etch produced by such a modified plasma processing system is found to be more reproducible for some etches relative to the etches produced by current unmodified plasma processing systems (which do not include provisions for a temperature control mechanism).

While not wishing to be bound by theory, it is believed that the lack of temperature control in unmodified plasma processing systems undesirably impacts oxide etch characteristics over time and suffers from poor reproducibility. It is believed that the temperature of shower head 108 is also controlled by the temperature control mechanism mentioned above. It has been found that during oxide etching, a certain amount of polymer from the plasma generated in chamber 102 condenses on the relatively cooler surface of shower head 108. When other etch chemistries (different from the present invention) and those chemistries known to those skilled in the art are employed to facilitate etching, there may be a polymer shortage at the substrate 110 etch front. This polymer shortage is believed to disrupt the required well known balance between polymer formation and oxide etching. As will be explained later, the chemistries of the present invention, however, provide optimum etch characteristics in modified plasma processing systems.

Still referring to FIG. 2, a turbomolecular pump 118, typically located below or on the side of chamber 102, maintains the appropriate pressure inside chamber 102. Turbomolecular pump 118 is shown to be below chamber 102 in plasma reactor 100. In one embodiment, turbomolecular pump 118 has a capacity of 2000 liters/sec. In an effort to reduce cost, however, the modified plasma reactor design, according to a preferred embodiment of the present invention, employs a turbomolecular pump 118 having a relatively low capacity of about 1,300 liters/sec. Low capacity turbomolecular pumps, while being much less expensive than their high capacity counterparts, however changes the rate at which exhaust byproduct gases are removed from the chamber interior, which impacts the etch process. This is because the flow rate of the etchant source gas into the chamber must also be reduced to keep the pressure in the low pressure ranges desired for oxide etching. One aspect of the present invention, as discussed below, involves finding the appropriate parameters that allow oxide etching to occur with small widths, high aspect ratios, and high selectivities to other layers in the modified inductively coupled plasma processing reactor using the two inventive chemistries.

It should be noted that the etch parameters associated with a high total flow rate into the plasma processing chamber (of the source etchant gases, additives and the like), which total flow rate may be accommodated by the use of a turbomolecular pump having a high capacity of about 2000 liters/sec to keep the pressure low, provides oxide etch results that may not be realizable when the total flow rate is reduced. As mentioned earlier, the total flow rate into the chamber is reduced when a low capacity turbomolecular pump is employed since a balance needs to be maintained between the inflow and the outflow in order to maintain the chamber pressure within the desired low pressure ranges during etching.

An additional complication is introduced if the low capacity pump is employed in conjunction with a high volume chamber (e.g., by raising the gap as is done in the modified plasma processing reactor of the present invention). In this case, process parameters that produce commercially acceptable etch rates and oxide etch characteristics in an etching process that employs a plasma chamber of a relatively small volume (because the gap between chuck 112 and shower head 108 is less than 10 cm, for example) and/or a relatively high capacity turbomolecular pump (of about 2,000 liters/sec, for example) may not provide acceptable etch rates and oxide etch characteristics when they are implemented in an etching process that employs a plasma chamber of a relatively large volume (because the gap between chuck 118 and shower head 108 is about 10 cm, for example) and/or uses a relatively low capacity turbomolecular pump (of about 1,300 liters/sec, for example). The invention, in one embodiment, involves the use of novel chemistries in a modified inductively coupled plasma processing reactor that has a relatively large gap, a cooled top electrode, and a low capacity turbomolecular pump to etch features in the oxide layer while achieving small widths, high aspect ratios, and good selectivities.

In accordance with one embodiment of the present invention, an inventive etch process employing an etch chemistry that includes $CH_2F_2$, $C_4F_8$ and $O_2$ is employed to achieve etched features having an etched feature size of between about 0.2 to 0.35 microns with an aspect ratio of about 10:1. Also, the inventive etch process produces an etch profile of 88 degrees and maintains a relatively high oxide-to-photoresist selectivity of about 5:1 and a oxide-to-silicon (monocrystalline or polycrystalline) selectivity of about 50:1. The etch profile is measured as an angle formed by the etch side wall with a plane parallel to the top surface of the oxide layer.

Figure 3A:
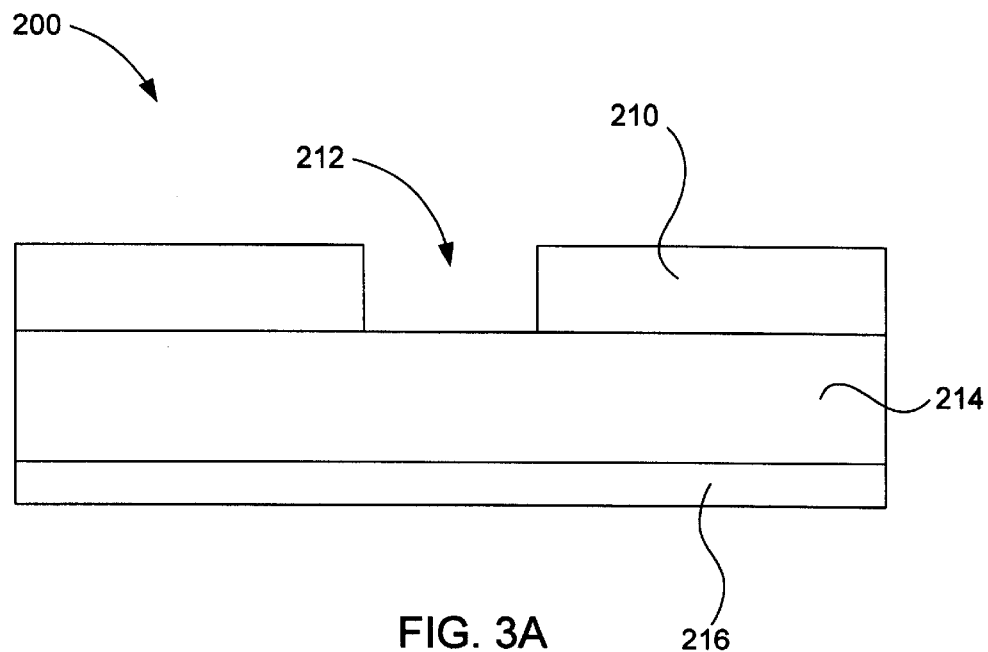
FIG. 3a illustrates a cross-sectional view of a layer stack, including the oxide layer, prior to being etched using the inventive etch process that employs the $CH_2F_2/C_4F_8/O_2$ etchant source gas.

FIG. 3a illustrates a typical layer stack 200 that may be etched with the inventive etch process employing the etchant source gas chemistry that includes $CH_2F_2/C_4F_8/O_2$. A photoresist layer 210 with a patterned mask opening 212 is disposed above an oxide layer 214. The oxide layer 214 is disposed above a substrate having thereon a silicon layer 216 (monocrystalline or polycrystalline), which underlies the target oxide layer.

Figure 3B:
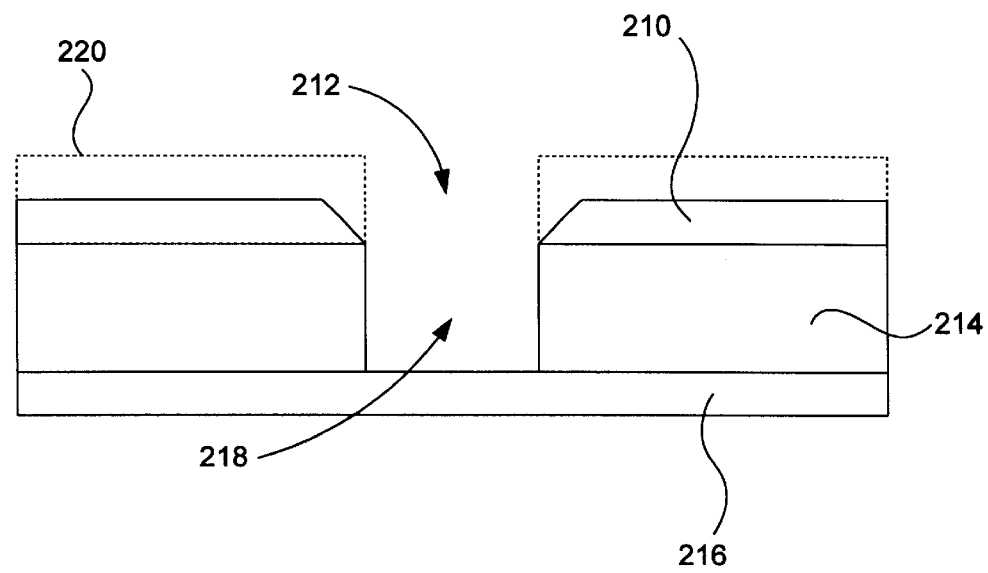
FIG. 3b shows the same layer stack of FIG. 3a after a contact opening has been etched through the oxide layer using the inventive etch process that employs the $CH_2F_2/C_4F_8/O_2$ etchant source gas.

FIG. 3b shows the layer stack 200 of FIG. 3a after etching is accomplished using the inventive etch process, which employs a $CH_2F_2/C_4F_8/O_2$-based etchant source gas. Through the patterned mask opening 212, etchants (formed by a plasma created with the inventive gas chemistry) react with the material of the oxide layer 214 to an etched feature 218 in oxide layer 212. During this etching process, the plasma tends to anisotropically etch etched feature 218. The plasma also tends to erode away some of photoresist layer 210 from an initial thickness (shown by the dotted lines 220) to the final thickness shown. Due to the high oxide-to-photoresist selectivity, however, some photoresist remains after etching to protect areas of the oxide layer where etching is not desired. Further, the high oxide-to-silicon selectivity causes the etch to essentially stop on underlying silicon layer 216 as shown.

It is also discovered that the inventive etch process employing the $CH_2F_2/C_4F_8/O_2$-based etchant source gas also has a high oxide-to-tungsten selectivity. Thus, the underlying layer may be formed of any tungsten-based metal and the inventive etch process effectively stops thereon after etching through the oxide layer. Two such tungsten-based metals are W or WSi.

In accordance with one embodiment of the present invention, an inventive etch process employing an etch chemistry that includes $C_3H_3F_5$, $C_4F_8$ and $O_2$ is employed to achieve etched features having an etched feature size of about 0.25 microns and below with an aspect ratio of greater than 7:1. Also, the inventive etch process maintains a relatively high oxide-to-photoresist selectivity of about 5:1 and a oxide-to-silicon (monocrystalline or polycrystalline) selectivity of about 50:1. The chemistry employed in this process also offers advantages with low toxicity, nonflammability, and low reactivity.

Figure 4A:
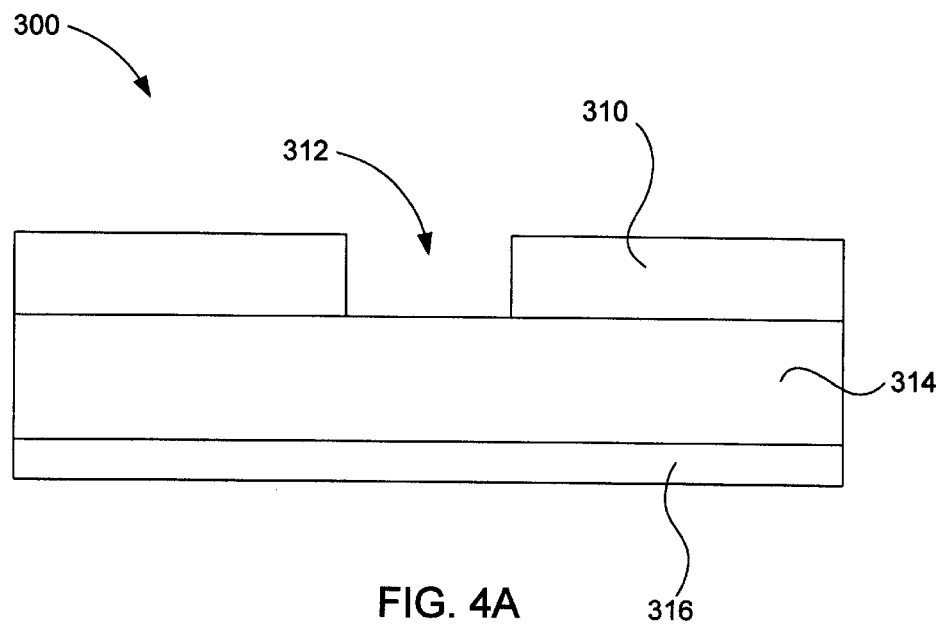
FIG. 4a illustrates a cross-sectional view of a layer stack, including the oxide layer, prior to being etched using the inventive etch process that employs the $C_3H_3F_5/C_4F_8/O_2$ etchant source gas.

FIG. 4a illustrates a typical layer stack 300 that may be etched with the inventive etch process employing the etchant source gas chemistry that includes $C_3H_3F_5/C_4F_8/O_2$. A photoresist layer 310 with a patterned mask opening 312 is disposed above an oxide layer 314. The oxide layer 314 is disposed above a substrate having thereon a silicon layer 316 (monocrystalline or polycrystalline), which underlies the target oxide layer.

Figure 4B:
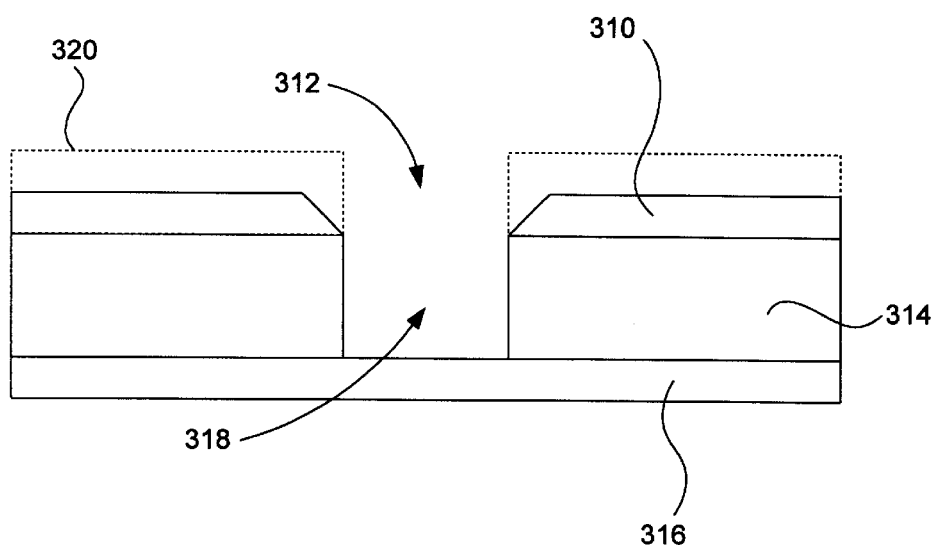
FIG. 4b shows the same layer stack of FIG. 4a after a contact opening has been etched through the oxide layer using the inventive etch process that employs the $C_3H_3F_5/C_4F_8/O_2$ etchant source gas.

FIG. 4b shows the layer stack 300 of FIG. 4a after etching is accomplished using the inventive etch process, which employs a $C_3H_3F_5/C_4F_8/O_2$-based etchant source gas. Through the patterned mask opening 312, etchants (formed by a plasma created with the inventive gas chemistry) react with the material of the oxide layer 314 to an etched feature 318 in oxide layer 312. During this etching process, the plasma tends to anisotropically etch etched feature 318. The plasma also tends to erode away some of photoresist layer 310 from an initial thickness (shown by the dotted lines 320) to the final thickness shown. Due to the high oxide-to-photoresist selectivity, however, some photoresist remains after etching to protect areas of the oxide layer where etching is not desired. Further, the high oxide-to-silicon selectivity causes the etch to essentially stop on underlying silicon layer 316 as shown.

It is also discovered that the inventive etch process employing the $C_3H_3F_5/C_4F_8/O_2$-based etchant source gas also has a high oxide-to-titanium nitride (TiN) selectivity. In some processes a nitride layer is needed for a diffusion barrier. Thus, the underlying layer may be formed of TiN, and the inventive etch process effectively stops thereon after etching through the oxide layer. In one embodiment, the oxide-to-TiN selectivity is about 20:1.

Figure 5:
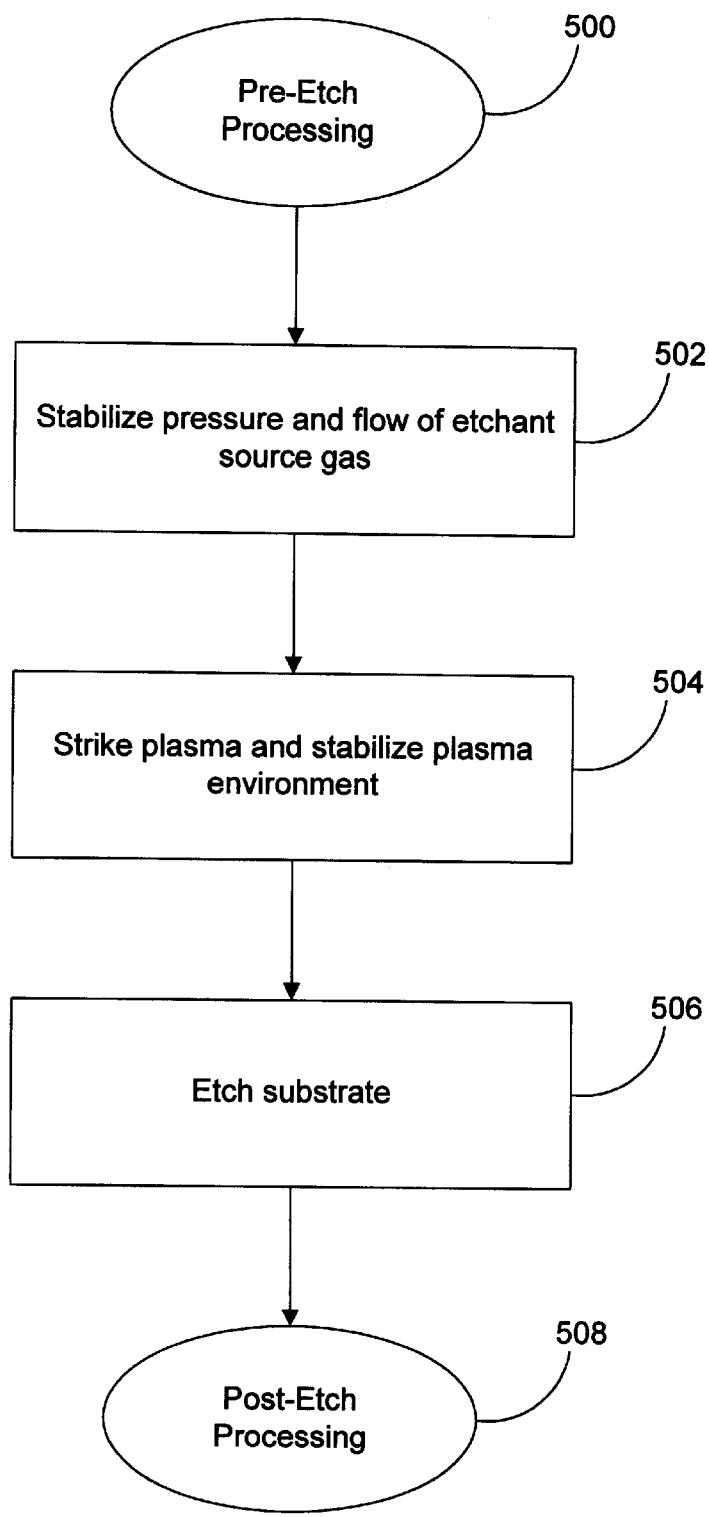
FIG. 5 is a flowchart that illustrates the etching process, in accordance with one embodiment of the present invention.

To further illustrate the etching process, FIG. 5 shows a flow diagram of the relevant steps involved in etching an oxide layer with the inventive etch processes. Prior to etching, conventional pre-etch steps, which may involve preparation of the substrate and the plasma reactor, are performed. These pre-etch steps (step 500) are conventional and readily understood by those skilled in the art. Typically, etching an oxide layer includes three steps. The first step 502 (flow) involves stabilizing the pressure and the flow of the etchant source gas. The etchant source gas is flowed into the chamber and allowed to stabilize at a specific pressure. Once the gas is stable the second step begins. The second step 504 (strike) includes striking the plasma with a first RF power source connected to the inductive electrode. The ignited plasma is then stabilized to a specific etch pressure inside the chamber. After the chamber pressure has stabilized, the third step 506 (etch), which is the actual etch step, takes place. During the etch step, a bias power is preferably placed on the bottom electrode to accelerate the ions toward the substrate.

The plasma etches the oxide layer and is terminated using a conventional endpointing process. Thereafter, conventional post-etch processing (step 508) may be performed. These post-etch processing steps are well known to those skilled in the art and may include additional processing steps to form the IC or flat panel display products.

In two exemplary applications of this invention, a 200 mm substrate having thereon an oxide layer, e.g., a silicon-dioxide containing layer (e.g., TEOS, BPSG, PSG, or the like) is etched in the aforementioned modified TCP™ 9100 plasma processing system. However, it should be noted that this invention is not limited to a particular sized substrate.

Application #1

In this application, a BPSG layer is etched using an etch process that employs the $CH_2F_2/C_4F_8/O_2$-based chemistry in the modified TCP™ 9100 plasma etch reactor. The substrate is 200 mm in diameter, with about a 4.0 microns thick layer of BPSG overlying a monocrystalline silicon underlying layer. The thickness of the photoresist layer is between about 6,000 to 8,000 angstroms. The bottom electrode is He cooled and operates at a temperature of about 20 degrees Celsius.

The pressure within the aforementioned plasma processing reactor system is preferably maintained from about 5 milliTorr (mT) to about 30 mT, more preferably from about 20 mT to about 30 mT and preferably at about 30 mT during etching. The top RF power is preferably maintained from about 500 watts (W) to about 2000 W, more preferably from about 1200 W to about 1500 W and preferably at about 1500 W during etching. The bottom electrode power is preferably maintained from about 500 watts (W) to about 2000 W, more preferably from about 700 W to about 1100 W and preferably at about 900 W during etching.

The flow rate of $CH_2F_2$ is preferably from about 20 standard cubic centimeters per minute (sccm) to about 50 sccm, more preferably from about 40 sccm to about 50 sccm and preferably at about 50 sccm during etching. Preferably, the flow rate of $CH_2F_2$ is between about 10% to 50% of the total flow. The flow rate of $C_4F_8$ is preferably from about 5 standard cubic centimeters per minute (sccm) to about 30 sccm, more preferably from about 10 sccm to about 20 sccm and preferably at about 20 sccm during etching. The ratio of the $C_4F_8$ flow rate to the $CH_2F_2$ flow rate is preferably from about 10% to 150% and preferably at about 40%. Preferably, the $C_4F_8$ flow rate is between about 5% to 30% of the total flow. The flow rate of $O_2$ is may be as little as 0 standard cubic centimeters per minute (sccm) to about 30 sccm, more preferably from about 10 sccm to about 20 sccm and preferably at about 17 sccm during etching. The ratio of the $O_2$ flow rate to the $CH_2F_2$ flow rate is preferably from about 0% to 150% and preferably at about 30%. Preferably, the $O_2$ flow rate is between about 0% to 30% of the total flow. The etch source gas described above may include a diluent gas, such as Argon.

It should be noted, however, that the flow rates of the component source gases may be scaled as needed when larger substrates are involved. Thus, while the relative flow rate among the various component gases (which may be expressed as a percentage of the $CH_2F_2$ flow rate) is important, the absolute flow rate for each component gas may be modified as needed to accommodate different substrate sizes.

When the substrate is etched using the above-disclosed etch parameters and chemistry, aspect ratios of greater than 10:1 (feature sizes of 0.2 microns and 0.35 microns with respective depths of 2.4 microns and 4 microns) are achieved. Also, the oxide-to-photoresist selectivity is about 5:1 without significant adverse impact on the etch profile and/or etch rate. In fact, the etch profile produced has an 88 degree taper.

Application #2

In this application, a TEOS layer is etched using an etch process that employs the $C_3H_3F_5/C_4F_8/O_2$-based chemistry in the modified TCP™ 9100 plasma etch reactor. The substrate is 200 mm in diameter, with about a 1.0 micron thick layer of TEOS overlying a TiN underlying layer. The thickness of the photoresist layer is between about 8,000 to 10,000 angstroms. The bottom electrode is He cooled and operates at a temperature of about 20 degrees Celsius.

The pressure within the aforementioned plasma processing reactor system is preferably maintained from about 5 milliTorr (mT) to about 30 mT, more preferably from about 20 mT to about 30 mT and preferably at about 30 mT during etching. The top RF power is preferably maintained from about 500 watts (W) to about 2000 W, more preferably from about 1200 W to about 2000 W and preferably at about 1700 W during etching. The bottom electrode power is preferably maintained from about 500 watts (W) to about 2000 W, more preferably from about 1200 W to about 2000 W and preferably at about 1700 W during etching.

The flow rate of $C_3H_3F_5$ is preferably from about 5 standard cubic centimeters per minute (sccm) to about 30 sccm, more preferably from about 10 sccm to about 20 sccm and preferably at about 20 sccm during etching. Preferably, the $C_3H_3F_5$ flow rate is between about 5% to 30% of the total flow. The flow rate of $C_4F_8$ is preferably from about 5 standard cubic centimeters per minute (sccm) to about 30 sccm, more preferably from about 5 sccm to about 15 sccm and preferably at about 8 sccm during etching. The ratio of the $C_4F_8$ flow rate to the $C_3H_3F_5$ flow rate is preferably from about 10% to 300% and preferably at about 50%. Preferably, the $C_4F_8$ flow rate is between about 0% to 30% of the total flow. The flow rate of $O_2$ is may be as little as 0 standard cubic centimeters per minute (sccm) to about 30 sccm, more preferably from about 10 sccm to about 20 sccm and preferably at about 15 sccm during etching. The ratio of the $O_2$ flow rate to the $C_3H_3F_5$ flow rate is preferably from about 10% to 300% and preferably at about 50%. Preferably, the $O_2$ flow rate is between about 0% to 30% of the total flow. The etch source gas described above may include a diluent gas, such as Argon.

It should be noted, however, that the flow rates of the component source gases may be scaled as needed when larger substrates are involved. Thus, while the relative flow rate among the various component gases (which may be expressed as a percentage of the $C_3H_3F_5$ flow rate) is important, the absolute flow rate for each component gas may be modified as needed to accommodate different substrate sizes.

When the substrate is etched using the above-disclosed etch parameters and chemistry, aspect ratios of greater than 7:1 (feature size of 0.25 microns and a depth of 1.8 microns) are achieved. Also, the oxide-to-photoresist selectivity is about 5:1 without significant adverse impact on the etch profile and/or etch rate. Also, the gas chemistry of $C_3H_3F_5/C_4F_8/O_2$ produces a TiN selectivity of about 20:1. Another distinct advantage of the gas chemistry of $C_3H_3F_5/C_4F_8/O_2$ is its low global warming potential, low toxicity, low reactivity and non-flammability.

It is observed that the present invention provides the ability to etch smaller features with high aspect ratios through an oxide layer while offering high selectivities with photoresist and a plurality of different underlying layers, e.g., silicon, tungsten-based metal and TiN. The present invention is capable of etching feature sizes of 0.25 microns or smaller while achieving aspect ratios in a range of about 7:1 to greater than 10:1 without significant adverse impact on the etch profile and/or the etch rate. In the processes disclosed, photoresist selectivity was increased to about 5:1 and in one embodiment the TiN selectivity was about 20:1. Also, uniform etching from the inside to outside edge of the substrate is achieved by confining the plasma and increasing its volume with a large gap between the top electrode and the substrate.

A further advantage of the chemistry of $C_3H_3F_5/C_4F_8/O_2$ is that it is an environment friendly gas, it can be safely discharged to the atmosphere with minimal or no additional processing. This feature advantageously reduces the cost associated with abatement of harmful by-product gases.

While this invention has been described in terms of several preferred embodiments, there are alterations, permutations, and equivalents which fall within the scope of this invention. It should also be noted that there are many alternative ways of implementing the methods and apparatuses of the present invention. It is therefore intended that the following appended claims be interpreted as including all such alterations, permutations, and equivalents as fall within the true spirit and scope of the present invention.

What is claimed is:

1. In an inductively-coupled plasma processing chamber, a method of etching a feature in an oxide layer using a photoresist mask, said oxide layer being disposed above an underlying layer of a substrate, comprising:

flowing an etchant source gas that comprises $CH_2F_2, C_4F_8$ and $O_2$ into said plasma processing chamber;

forming a plasma from said etchant source gas; and etching through said oxide layer of said substrate with said plasma, wherein said etching substantially stops on said underlying layer, said underlying being one of a silicon layer and a tungsten-based layer.

2. The method of claim 1 wherein said plasma processing chamber includes a temperature-controlled top electrode.

3. The method of claim 1 wherein said plasma processing chamber includes a top electrode and said substrate being disposed on an electrostatic chuck during said etching, a distance between said top electrode and said electrostatic chuck is about 10 cm.

4. The method of claim 1 wherein said etchant source gas consists essentially of $CH_2F_2, C_4F_8$ and $O_2$.

5. The method of claim 1 wherein said oxide layer comprises of a material selected from a group consisting of BPSG, PSG and TEOS.

6. The method of claim 1 wherein said photoresist mask has a thickness between about 6,000 to 8,000 angstroms.

7. The method of claim 1 wherein said underlying layer is said silicon layer.

8. The method of claim 7 wherein said silicon layer is formed from one of a monocrystalline silicon material and a polysilicon material.

9. The method of claim 1 wherein said etchant source gas includes a diluent gas.

10. The method of claim 9 wherein said diluent gas is Argon.

11. The method of claim 1 wherein said underlying layer is said tungsten-based layer.

12. The method of claim 1 wherein said tungsten-based layer is one of a W layer and a WSi layer.

13. The method of claim 1 wherein said feature has a feature size of between about 0.2 to about 0.35 microns.

14. The method of claim 1 wherein said oxide layer has a depth between about 3 to about 4 microns.

15. The method of claim 1 wherein a ratio of a flow rate of said $C_4F_8$ to a flow rate of said $CH_2F_2$ is between about 10% and about 150%.

16. The method of claim 1 wherein a ratio of a flow rate of said $C_4F_8$ to a flow rate of said $CH_2F_2$ is about 40%.

17. The method of claim 1 wherein a ratio of a flow rate of said $O_2$ to a flow rate of said $CH_2F_2$ is between about 0% and about 150%.

18. The method of claim 1 wherein a ratio of a flow rate of said $O_2$ to a flow rate of said $CH_2F_2$ is about 30%.

19. The method of claim 1 wherein a flow rate of said $CH_2F_2$ is between about 10% to 50% of the total flow.

20. The method of claim 1 wherein a flow rate of said $C_4F_8$ is between about 5% to 30% of the total flow.

21. The method of claim 1 wherein a flow rate of said $O_2$ is between about 0% to 30% of the total flow.

22. In an inductively-coupled plasma processing chamber, a method of etching a feature in an oxide layer using a photoresist mask, said oxide layer being disposed above an underlying layer of a substrate, said substrate being disposed on an electrostatic chuck in said plasma processing chamber during said etching, said method comprising:

flowing an etchant source gas that comprises $CH_2F_2, C_4F_8$ and $O_2$ into said plasma processing chamber;

forming a plasma from said etchant source gas; and etching through said oxide layer of said substrate with said plasma, said etching substantially stops on said underlying layer, said underlying being one of a silicon layer and a tungsten-based layer, wherein said plasma processing chamber includes a temperature-controlled top electrode, a distance between said top electrode and said electrostatic chuck is about 10 cm during said etching.

23. The method of claim 22 wherein said underlying layer is said silicon layer.

24. The method of claim 22 wherein said diluent gas is Argon.

25. The method of claim 22 wherein said underlying layer is said tungsten-based layer.

26. The method of claim 25 wherein said tungsten-based layer is one of a W layer and a WSi layer.

27. The method of claim 22 wherein said feature has a feature size of between about 0.2 to about 0.35 microns.

28. The method of claim 22 wherein said oxide layer has a thickness between about 3 to about 4 microns.

29. The method of claim 22 wherein a ratio of a flow rate of said $C_4F_8$ to a flow rate of said $CH_2F_2$ is between about 10% and about 100%.

30. The method of claim 22 wherein a ratio of a flow rate of said $C_4F_8$ to a flow rate of said $CH_2F_2$ is about 40%.

31. The method of claim 22 wherein a ratio of a flow rate of said $O_2$ to a flow rate of said $CH_2F_2$ is between about 0% and about 150%.

32. The method of claim 22 wherein a ratio of a flow rate of said $O_2$ to a flow rate of said $CH_2F_2$ is about 30%.

33. The method of claim 22 wherein a flow rate of said $CH_2F_2$ is between about 10% to 50% of the total flow.

34. The method of claim 22 wherein a flow rate of said $C_4F_8$ is between about 5% to 30% of the total flow.

35. The method of claim 22 wherein a flow rate of said $O_2$ is between about 0% to 30% of the total flow.

36. In an inductively-coupled plasma processing chamber, a method of etching a feature in an oxide layer using a photoresist mask, said oxide layer being disposed above an underlying layer of a substrate, comprising:

flowing an etchant source gas that comprises $C_3H_3F_5$, $C_4F_8$ and $O_2$ into said plasma processing chamber;

forming a plasma from said etchant source gas; and etching through said oxide layer of said substrate with said plasma, wherein said etching substantially stops on said underlying layer, said underlying being one of a silicon layer and a TiN layer.

37. The method of claim 36 wherein said plasma processing chamber includes a temperature-controlled top electrode.

38. The method of claim 36 wherein said plasma processing chamber includes a top electrode and said substrate being disposed on an electrostatic chuck during said etching, a distance between said top electrode and said electrostatic chuck is about 10 cm.

39. The method of claim 36 wherein said etchant source gas consists essentially of $C_3H_3F_5, C_4F_8$ and $O_2$.

40. The method of claim 36 wherein said oxide layer comprises of a material selected from a group consisting of BPSG, PSG and TEOS.

41. The method of claim 36 wherein said photoresist mask has a thickness between about 8,000 to 10,000 angstroms.

42. The method of claim 36 wherein said underlying layer is said silicon layer.

43. The method of claim 42 wherein said silicon layer is formed from one of a monocrystalline silicon material and a polysilicon material.

44. The method of claim 36 wherein said etchant source gas includes a diluent gas.

45. The method of claim 44 wherein said diluent gas is Argon.

46. The method of claim 36 wherein said underlying layer is said TiN layer.

47. The method of claim 36 wherein said feature has a feature size that is less than about or about 0.25 microns.

48. The method of claim 36 wherein said oxide layer has a depth that is about 1.8 microns.

49. The method of claim 36 wherein a ratio of a flow rate of said $C_4F_8$ to a flow rate of said $C_3H_3F_5$ is between about 10% and about 300%.

50. The method of claim 36 wherein a ratio of a flow rate of said $C_4F_8$ to a flow rate of said $C_3H_3F_5$ is about 50%.

51. The method of claim 36 wherein a ratio of a flow rate of said $O_2$ to a flow rate of said $C_3H_3F_5$ is between about 10% and about 300%.

52. The method of claim 36 wherein a ratio of a flow rate of said $O_2$ to a flow rate of said $C_3H_3F_5$ is about 50%.

53. The method of claim 36 wherein a flow rate of said $C_3H_3F_5$ is between about 5% to 30% of the total flow.

54. The method of claim 36 wherein a flow rate of said $C_4F_8$ is between about 0% to 30% of the total flow.

55. The method of claim 36 wherein a flow rate of said $O_2$ is between about 0% to 30% of the total flow.

56. In an inductively-coupled plasma processing chamber, a method of etching a feature in an oxide layer using a photoresist mask, said oxide layer being disposed above an underlying layer of a substrate, said substrate being disposed on an electrostatic chuck in said plasma processing chamber during said etching, said method comprising:

flowing an etchant source gas that comprises $C_3H_3F_5$, $C_4F_8$ and $O_2$ into said plasma processing chamber;

forming a plasma from said etchant source gas; and etching through said oxide layer of said substrate with said plasma, said etching substantially stops on said underlying layer, said underlying being one of a silicon layer and a TiN layer, wherein said plasma processing chamber includes a temperature-controlled top electrode, a distance between said top electrode and said electrostatic chuck is about 10 cm during said etching.

57. The method of claim 56 wherein said underlying layer is said silicon layer.

58. The method of claim 56 wherein said diluent gas is Argon.

59. The method of claim 56 wherein said underlying layer is said TiN layer.

60. The method of claim 56 wherein said feature has a feature size that is less than about or about 0.25 microns.

61. The method of claim 56 wherein said oxide layer has a thickness about 1.8 microns.

62. The method of claim 56 wherein a ratio of a flow rate of said $C_4F_8$ to a flow rate of said $C3H_3F_5$ is between about 10% and about 300%.

63. The method of claim 56 wherein a ratio of a flow rate of said $C_4F_8$ to a flow rate of said $C3H_3F_5$ is about 50%.

64. The method of claim 56 wherein a ratio of a flow rate of said $O_2$ to a flow rate of said $C3H_3F_5$ is between about 10% and about 300%.

65. The method of claim 56 wherein a ratio of a flow rate of said $O_2$ to a flow rate of said $C3H_3F_5$ is about 50%.

66. The method of claim 56 wherein a flow rate of said $C_3H_3F_5$ is between about 5% to 30% of the total flow.

67. The method of claim 56 wherein a flow rate of said $C_4F_8$ is between about 0% to 30% of the total flow.

68. The method of claim 56 wherein a flow rate of said $O_2$ is between about 0% to 30% of the total flow.

* * * * *